(12) United States Patent
Kim et al.

(10) Patent No.: US 7,604,927 B2
(45) Date of Patent: Oct. 20, 2009

(54) METHODS OF PATTERNING USING PHOTOMASKS INCLUDING SHADOWING ELEMENTS THEREIN AND RELATED SYSTEMS

(75) Inventors: SoonHo Kim, Gyeonggi-do (KR); Seongyong Moon, Gyeonggi-do (KR); Jinhong Park, Seoul (KR); Seongwoon Choi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 454 days.

(21) Appl. No.: 11/668,081

(22) Filed: Jan. 29, 2007

(65) Prior Publication Data
US 2007/0122751 A1 May 31, 2007

Related U.S. Application Data

(60) Division of application No. 10/775,772, filed on Feb. 9, 2004, now Pat. No. 7,241,539, which is a continuation-in-part of application No. 10/623,616, filed on Jul. 22, 2003, now Pat. No. 7,001,697.

(30) Foreign Application Priority Data

Oct. 7, 2002 (KR) .............................. 2002-61046
Nov. 26, 2003 (KR) ....................... P2003-0084715

(51) Int. Cl.
*G03F 7/20* (2006.01)
(52) U.S. Cl. ..................................... 430/311
(58) Field of Classification Search ........... 430/5, 430/30, 311; 359/558, 559
See application file for complete search history.

(56) References Cited

U.S. PATENT DOCUMENTS 4,861,402 A    8/1989   Gordon (Continued)

FOREIGN PATENT DOCUMENTS

CN    1111292 A    11/1995

(Continued)

OTHER PUBLICATIONS

U.S. Appl. No. 10/623,616.

(Continued)

*Primary Examiner*—Stephen Rosasco
(74) *Attorney, Agent, or Firm*—Myers Bigel Sibley & Sajovec, P.A.

(57) ABSTRACT

A photomask for patterning an integrated circuit device using a patterning radiation may include a transparent substrate, a pattern of radiation blocking regions, an array of radiation blocking regions, and an array of shadowing elements. The transparent substrate may have first and second opposing surfaces, and the pattern of radiation blocking regions may be on at least one of the first and/or second surfaces of the transparent substrate. Moreover, the pattern of radiation blocking regions may define a pattern to be transferred to the integrated circuit substrate. The array of shadowing elements may be provided within the transparent substrate between the first and second opposing surfaces wherein a shadowing element of the array has a light transmittance characteristic different than that of an adjacent portion of the transparent substrate. Moreover, a transmittance of the patterning radiation through a portion of the transparent substrate including the array of shadowing elements may be greater than approximately 20%. Related methods and systems are also discussed.

16 Claims, 6 Drawing Sheets

U.S. PATENT DOCUMENTS

| | | |
|---|---|---|
| 5,387,484 A | 2/1995 | Doany et al. |
| 5,624,773 A | 4/1997 | Pforr et al. |
| 5,745,617 A | 4/1998 | Starodubov et al. |
| 6,048,648 A | 4/2000 | Hashimoto et al. |
| 6,120,942 A | 9/2000 | Reinberg |
| 6,335,126 B1 | 1/2002 | Kondou et al. |
| 6,544,914 B1 | 4/2003 | Kikugawa et al. |
| 7,001,697 B2 | 2/2006 | Park et al. |
| 2001/0012099 A1 | 8/2001 | Kumagai |
| 2001/0019407 A1 | 9/2001 | Sato et al. |
| 2004/0067422 A1 | 4/2004 | Park et al. |
| 2005/0158634 A1 | 7/2005 | Thony |

FOREIGN PATENT DOCUMENTS

| | | |
|---|---|---|
| JP | 09-061986 | 3/1997 |
| JP | 9-61986 | 3/1997 |
| JP | 10-161297 | 6/1998 |
| JP | 2001-272764 | 10/2001 |
| KR | 1999-0065144 | 8/1999 |
| KR | 2001-0052399 | 6/2001 |
| KR | 2001-0062343 | 7/2001 |
| KR | 2002-0027803 | 4/2002 |
| KR | 2003-0029329 | 4/2003 |

OTHER PUBLICATIONS

N.H. Rizvi; *Femtosecond laser micromachining: Current status and applications*, Riken Review No. 50 Focused on Laser Precision Microfabrication (LPM 2002), Jan. 2003 pp. 1-9.

"Photomask Defect Repair Systems" DRS Series; Industrial—Photomask Defect Repair Systems, Quantronix Products Catalog 2003, pp. 24-60.

Translation of an Office Action as issued by the German Patent and Trademark Office for Official File No. 10 2004 057 180.5-51.

Chinese First Office Action (13 pages) corresponding to Chinese Patent Application No. 2004100963513; Dated: Jan. 9, 2009.

METHODS OF PATTERNING USING PHOTOMASKS INCLUDING SHADOWING ELEMENTS THEREIN AND RELATED SYSTEMS

RELATED APPLICATIONS

The present application claims the benefit of priority as a divisional of U.S. application Ser. No. 10/775,772 filed Feb. 9, 2004 now U.S. Pat. No. 7,241,539, which claims the benefit of priority as a continuation-in-part from U.S. application Ser. No. 10/623,616 filed Jul. 22, 2003 now U.S. Pat. No. 7,001, 697,which claims the benefit of priority from Korean Application No. 2002-61046 filed Oct. 7, 2002. U.S. application Ser. No. 10/775,772 also claims the benefit of priority from Korean Application No. P2003-0084715 filed Nov. 26, 2003. The present application thus claims the benefit of priority of all of the above referenced U.S. and Korean applications, and the disclosures of all of the above referenced U.S. and Korean applications are hereby incorporated herein in their entirety by reference.

FIELD OF THE INVENTION

The present invention relates to the field of integrated circuits and more particularly to photomasks used to pattern integrated circuit devices and related methods and systems.

BACKGROUND

Photomasks are used in the patterning of integrated circuit devices, and a conventional photomask may include microscopic images on a transparent substrate. As shown in FIG. 9, a photomask 901 may include a transparent substrate 903 (such as a glass and/or quartz substrate) with a microscopic image provided in a patterned layer 905 (such as a patterned layer of chrome) on a surface of the transparent substrate 903. The microscopic image may be transferred from the photomask to a photosensitive layer (such as photoresist) on a integrated circuit wafer using photolithographic techniques wherein patterning radiation (such as light) is transmitted through the photomask onto the photosensitive layer. Accordingly, portions of the photosensitive layer corresponding to openings in the patterned layer of chrome 905 are selectively exposed to the patterning radiation, while portions of the photosensitive layer corresponding to chrome portions of the patterned layer are masked from the patterning radiation. After exposure to the patterning radiation through the photomask, the photosensitive layer can be developed to form the desired pattern in the photosensitive layer. The photosensitive layer having the desired pattern can then be used as an etching mask for a layer of the integrated circuit device.

A critical dimension of an integrated circuit pattern may be defined as a width of a line or space that has been identified as being critical to the device being fabricated. Portions of the pattern on the transparent substrate may include a same critical dimension across different portions of the photomask, and the critical dimension is ideally reproduced uniformly in the photosensitive layer across different portions of the integrated circuit device. A uniformity of a critical dimension formed at different portions of an integrated circuit device, formed at different integrated circuit devices on a same semiconductor wafer, and formed on different semiconductor wafers may vary, however, even when using a same photomask.

According to current photolithographic technologies, a photomask may include a pattern for a layer of a single integrated circuit device or a small number of adjacent integrated circuit devices, but not for all integrated circuit devices on a wafer. Accordingly, the photomask may need to be "scanned" or "stepped" to separately expose different parts of a same photosensitive layer on a same wafer. For a photomask including a pattern for a layer of a single integrated circuit device, the photomask may need to be sequentially aligned to each integrated circuit device on the wafer and a separate dose of patterning radiation may need to be provided for each integrated circuit device.

Non-uniformity of a critical dimension across a semiconductor wafer and/or from wafer to wafer using a same mask may be a result, for example, of variations in coating the photosensitive layer, variations in exposing the photosensitive layer to the patterning radiation, variations in developing the photosensitive layer after exposure, variations in baking the photosensitive layer, and/or variations in etching a layer on the wafer using the patterned photosensitive layer as a mask. Non-uniformities of a critical dimension across a same integrated circuit device may be a result, for example, of differences in intensities of patterning radiation reaching the photosensitive layer on the integrated circuit device.

Even if critical dimensions of the patterned layer of the photomask are provided without error, characteristics of the exposure apparatus and/or of the photomask may introduce non-uniformities in critical dimensions formed on a photosensitive layer. For example, a critical dimension of a pattern formed in a photosensitive layer at a center of an integrated circuit device may generally be larger than a critical dimension of a pattern formed in the same photosensitive layer at an edge of the same integrated circuit device. This effect may be due to diffraction of the patterning radiation passing through the patterned layer of the photomask.

As shown in FIG. 10, patterning radiation 1001 may be provided to a backside of the transparent substrate 1005 opposite the patterned layer 1007. Moreover, the patterning radiation 1001 may be provided with a relatively uniform distribution of illumination intensity as illustrated by solid line 1021. The patterning radiation may also propagate through the transparent substrate 1005 with a relatively uniform distribution of illumination intensity as illustrated by solid line 1023. A uniformity of illumination intensity passing through openings in the patterned layer 1007, however, may vary across the substrate as illustrated by the dotted line 1025. The uniformity of illumination intensity passing through the openings in the patterned layer 1007 may vary, for example, because diffraction of light passing through openings in the patterned layer 1007 may be stronger at the center of the photomask 1003 than at edges of the photomask 1003. A resulting distribution of critical dimensions across a device being patterned is illustrated by the line 1027.

SUMMARY

According to embodiments of the present invention, a photomask may be provided for patterning an integrated circuit device using a patterning radiation. For example, the photomask may include a transparent substrate, a pattern of radiation blocking regions, and an array of shadowing elements. The transparent substrate may have first and second opposing surfaces, and the pattern of radiation blocking regions may be provided on at least one of the first and/or second surfaces of the transparent substrate. In addition, the pattern of radiation blocking regions may define a pattern to be transferred to the integrated circuit substrate. The array of shadowing elements may be provided within the transparent substrate between the first and second opposing surfaces wherein shadowing elements of the array have a light transmittance characteristic different than that of an adjacent portion of the transparent substrate. Moreover, a transmittance of the patterning radiation through a portion of the transparent substrate including the array of shadowing elements may be greater than approximately 20%.

A shadowing element of the array may have an index of refraction that is different than that of an adjacent portion of the transparent substrate, and an average of center-to-center spacings of the shadowing elements within the array may be at least approximately 6 µm. More particularly, an average of center-to-center spacing of the shadowing elements within the array may be at least approximately 8 µm. The transmittance of the patterning radiation through portions of the transparent substrate including the array of shadowing elements may be greater than approximately 70%.

The photomask may also include a second array of shadowing elements within the transparent substrate between the first and second opposing surfaces, and shadowing elements of the second array may have a light transmittance characteristic different than that of an adjacent portion of the transparent substrate. A transmittance of the patterning radiation through a portion of the transparent substrate including the second array of shadowing elements may be greater than approximately 20%, and the transmittance of the patterning radiation through the portion of the transparent substrate including the second array may be different than the transmittance of the patterning radiation though the portion of the transparent substrate including the first array.

In addition, the first array of shadowing elements may be configured to provide a first illumination condition for a first portion of the integrated circuit substrate, and the second array of shadowing elements may be configured to provide a second illumination condition for a second portion of the integrated circuit substrate wherein the first and second illumination conditions are different. The first illumination condition may be one of annular illumination, dipole illumination, or quadrapole illumination, and the second illumination condition may be another of annular illumination, dipole illumination, or quadrapole illumination. An average of center-to-center spacings of the shadowing elements within the first array may be different than an average of center-to-center spacings of the shadowing elements within the second array. Moreover, the transmittance of the patterning radiation through portions of the transparent substrate including the first and second arrays of shadowing elements may be greater than approximately 70%.

The array of shadowing elements may be configured to provide a holographic pattern used to generate a hologram on the integrated circuit device, or the array of shadowing elements may be configured as a fresnel lens. In addition, the pattern of radiation blocking regions may be a pattern of a metal such as chrome. A diameter of a shadowing element in the array may be in the range of approximately 0.1 µm to 4 µm, and more particularly, in the range of approximately 0.3 µm to 1 µm.

According to additional embodiments of the present invention, a method may be provided for forming a photomask for patterning an integrated circuit device using a patterning radiation. For example, the method may include providing a transparent substrate, forming a pattern of radiation blocking regions, and forming an array of shadowing elements. The transparent substrate may have first and second opposing surfaces, and the pattern of radiation blocking regions may be formed on at least one of the first and/or second surfaces of the transparent substrate. Moreover, the pattern of radiation blocking regions may define a pattern to be transferred to the integrated circuit device. The array of shadowing elements may be formed within the transparent substrate between the first and second opposing surfaces wherein shadowing elements of the array have a light transmittance characteristic different than that of an adjacent portion of the transparent substrate. In addition, a transmittance of the patterning radiation through a portion of the transparent substrate including the array of shadowing elements may be greater than approximately 20%.

The method may also include providing a pellicle on the transparent substrate, and the array of shadowing elements may be formed with the pellicle on the substrate. Forming the array of shadowing elements may include providing laser radiation to portions of the transparent substrate for a shadowing element of the array. More particularly, a burst of laser radiation having a duration on the order of approximately $10^{-15}$ seconds may be provided for each of the shadowing elements of the array, and each burst of laser radiation may be on the order of approximately $10^6$ to $10^7$ W/cm$^2$. In addition, providing laser radiation to portions of the transparent substrate for each shadowing element of the array may generate a micro-explosion within the transparent substrate for each shadowing element of the array.

A shadowing element of the array may have an index of refraction that is different than that of an adjacent portion of the transparent substrate. An average of center-to-center spacings of the shadowing elements within the array may be at least approximately 6 µm, and more particularly, at least approximately 8 µm, and the transmittance of the patterning radiation through portions of the transparent substrate including the array of shadowing elements may be greater than approximately 70%.

According to still additional embodiments of the present invention, a method of patterning an integrated circuit device may include providing an integrated circuit substrate having a photosensitive layer thereon, and projecting patterning radiation through a photomask to the photosensitive layer on the integrated circuit substrate. More particularly, the photomask may include a transparent substrate, a pattern of radiation blocking regions, and an array of shadowing elements. The transparent substrate may have first and second opposing surfaces, and the pattern of radiation blocking regions may be on at least one of the first and/or second surfaces of the transparent substrate. More particularly, the pattern of radiation blocking regions may define a pattern to be transferred to the integrated circuit device. The array of shadowing elements may be provided within the transparent substrate between the first and second opposing surfaces wherein a shadowing element of the array has a light transmittance characteristic different than that of an adjacent portion of the transparent substrate. In addition, a transmittance of the patterning radiation through a portion of the transparent substrate including the array of shadowing elements may be greater than approximately 20%.

According to yet additional embodiments of the present invention, a system for patterning an integrated circuit device using patterning radiation may include a chuck, a photomask, and a radiation source. The chuck may be configured to receive an integrated circuit substrate having a photosensitive layer thereon, and the photomask may include a transparent substrate having first and second opposing surfaces, a pattern of radiation blocking regions, and an array of shadowing elements. The pattern of radiation blocking regions may be provided on at least one of the first and/or second surfaces of the transparent substrate, and the pattern of radiation blocking regions may define a pattern to be transferred to the integrated circuit substrate. The array of shadowing elements may be provided within the transparent substrate between the first and second opposing surfaces wherein a shadowing element of the array has a light transmittance characteristic different than that of an adjacent portion of the transparent substrate. In addition, a transmittance of the patterning radiation through a portion of the transparent substrate including the array of shadowing elements may be greater than approximately 20%. The system may also include a radiation source configured to project radiation through the photomask to the photoresist layer on the integrated circuit substrate.

DETAILED DESCRIPTION

Figure 1:
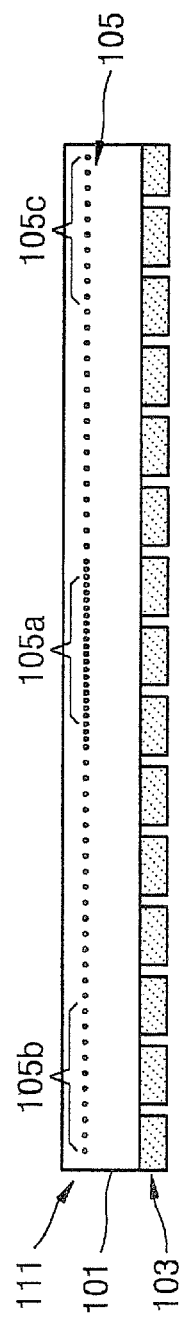
FIG. 1 is a cross-sectional view of a photomask according to embodiments of the present invention.

The present invention will now be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the size and the thickness of layers and regions are exaggerated for clarity. It will also be understood that when a layer is referred to as being on another layer or substrate, it can be directly on the other layer or substrate, or intervening layers may also be present. It will also be understood that when a layer or element is referred to as being connected to or coupled to another layer or element, it can be directly connected to or coupled to the other layer or element, or intervening layers or elements may also be present.

A photomask 111 for patterning an integrated circuit substrate according to embodiments of the present invention is illustrated in the cross-sectional view of FIG. 1. The photomask 111 may include a transparent substrate 101 (such as a glass or quartz substrate), an array(s) of shadowing elements 105 within a volume of the transparent substrate 101 between first and second surfaces of the transparent substrate, and a pattern of radiation blocking (or opaque) regions 103 on at least one of the first or second surfaces of the transparent substrate 101. The pattern of radiation blocking regions 103 may define a pattern to be transferred to the integrated circuit substrate, and each shadowing element 105 within the array(s) may have a light transmittance characteristic different than that of an adjacent portion of the transparent substrate.

More particularly, a shadowing element 105 may have an index of refraction that is different than that of an adjacent portion of the transparent substrate 101. In addition, a transmittance of the patterning radiation through portions of the transparent substrate including the array(s) of shadowing elements 105 is at least approximately 50%. Also, the pattern of radiation blocking regions 103 may be a patterned layer of a metal such as chrome, and a diameter of a shadowing element in the array(s) may be in the range of approximately 0.1 µm to 4 µm, and more particularly, in the range of approximately 0.3 µm to 1 µm.

The array(s) of shadowing elements 105 may be two-dimensional as shown in FIG. 1 such that the shadowing elements are in approximately a same plane in the photomask. More particularly, the shadowing elements may be arranged in arrays of rows and columns of shadowing elements with center-to-center spacings of shadowing elements of different arrays differing to provide different transmittance characteristics at different portions of the photomask. For example, center-to-center spacings of a first array 105a of shadowing elements at a central portion of the photomask may be less than center-to-center spacings of second and third arrays 105b and 105c of shadowing elements at edge portions of the photomask. Accordingly, a transmittance of patterning radiation through the first array 105a at the center of the photomask can be less than a transmittance of patterning radiation through the second and third arrays 105b and 105c of shadowing elements at edge portions of the photomask.

By providing different transmittances at different portions of the mask, a uniformity of patterning radiation intensity transmitted through the photomask 101 may be improved, and a uniformity of critical dimensions patterned on an integrated circuit device can be improved. As discussed above, diffraction generated by the radiation blocking pattern 103 may affect an attenuation of patterning radiation passing therethrough differently in different portions of the photomask. For example, diffraction generated by the radiation blocking pattern 103 may cause a greater attenuation of patterning radiation at edges of the photomask than at the center of the photomask. The array(s) 105 of shadowing elements may compensate for this non-uniformity of attenuation by providing a greater attenuation through the array 105a at the center of the photomask and by providing less attenuation through the arrays 105b-c at edges of the photomask. According to particular embodiments, a transmittance through the array(s) 105 of shadowing elements may be varied within the range of approximately 98% to 100% to improve a uniformity of patterning radiation provided at an integrated circuit device being patterned (with 100% being the transmittance of patterning radiation through a portion of the transparent substrate without shadowing elements).

Figure 2:
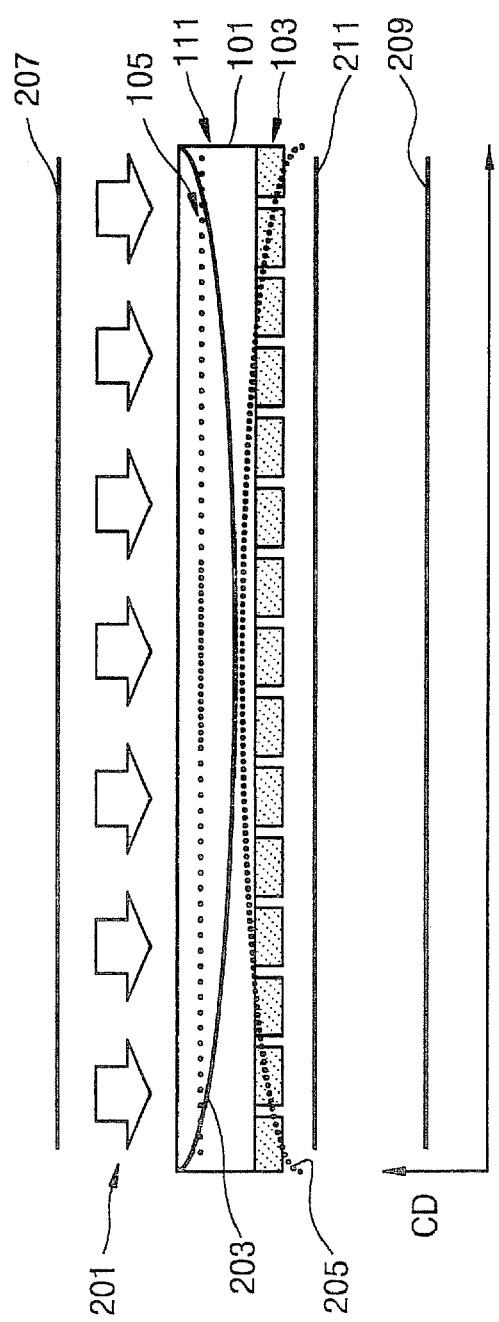
FIG. 2 is a cross-sectional view illustrating variations in illumination intensities using photomasks according to embodiments of the present invention.

As shown in FIG. 2, a source of patterning radiation may provide patterning radiation 201 of approximately uniform intensity across an entirety of the photomask 101. The line 207 is provided to show that an illumination intensity distribution for the patterning radiation 201 entering the transparent substrate 101 is approximately uniform across the entirety of the photomask. As discussed above, the array(s) 105 of shadowing elements may be arranged so that a density of the shadowing elements is greater in a central portion of the substrate and so that a density of the shadowing elements decreases as a distance from the center of the substrate increases. Accordingly, a transmittance through the array(s) 105 may be greatest near the edges of the substrate, and the transmittance through the array(s) 105 may be the least near the center of the substrate.

The solid line 203 illustrates a relative attenuation of transmittance of patterning radiation through different portions of the array(s) 105 of shadowing elements. As discussed above, diffraction of the patterning radiation passing through the radiation blocking pattern 103 may result in a greater attenuation of patterning radiation at edges of the photomask 111 as illustrated by the dotted line 205. Accordingly, effects of varying transmittance through different portions of the array(s) 105 of shadowing elements and effects of diffraction through the radiation blocking pattern 103 may be offset so that an approximately uniform intensity of patterning radiation is transmitted through the substrate 101 and the radiation blocking pattern 103 as illustrated by the solid line 211. Moreover, the line 209 illustrates that critical dimensions (CDs) across an integrated circuit device being patterned can be made approximately uniform using an array(s) of shadowing elements according to embodiments of the present invention.

Figure 3:
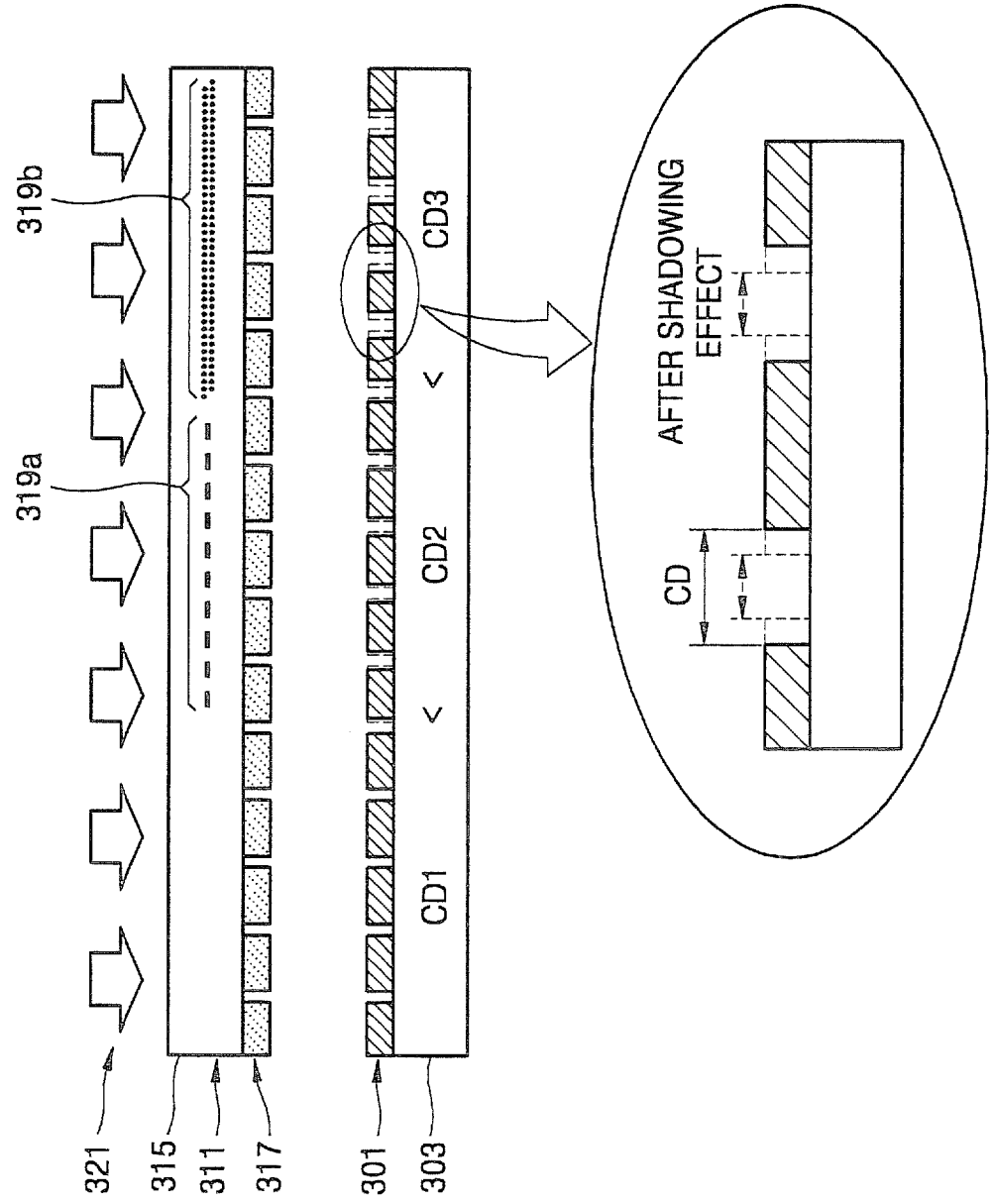
FIG. 3 is a cross-sectional view of another photomask according to embodiments of the present invention.

Moreover, factors other than diffraction through the radiation blocking pattern may affect the uniformity of critical dimensions on an integrated circuit device being patterned. As shown in FIG. 3, the critical dimensions CD 1, CD2, and CD3 of a pattern of photosensitive layer 301 (such as photoresist) may vary from relatively small (CD1) on one side of an integrated circuit device 303 being patterned to relatively large (CD3) on the other side of the integrated circuit device being patterned when using the photomask 311 without shadowing elements. The solid lines of the patterned photosensitive layer 301 illustrate dimensions of the pattern when formed using the photomask 311 prior to forming shadowing elements therein.

With knowledge of the CD non-uniformities resulting when the photomask is used without shadowing elements, a design for shadowing elements can be determined to improve the CD uniformity. The photomask 311 includes a transparent substrate 315 and a radiation blocking pattern 317 (such as a chrome pattern) on the transparent substrate 315. As shown, the radiation blocking pattern 317 defines the pattern to be transferred to the photosensitive layer 301 on the integrated circuit device 303. After CD non-uniformities have been determined and a design for shadowing elements has been determined, arrays of shadowing elements 319a and 319b can be formed in the transparent substrate 315 between first and second surfaces thereof. The shadowing elements can be formed, for example, using a femto second laser as discussed in greater detail below. Spacings, sizings, and/or placements of the shadowing elements, for example, may be determined empirically using trial and error and/or using simulation.

As shown in FIG. 3, the region of the transparent substrate 315 without any shadowing elements may provide a relatively high transmittance of patterning radiation therethrough, and the region of the transparent substrate 315 including the array 319b of shadowing elements may provide a relatively low transmittance of patterning radiation therethrough. The region of the transparent substrate 315 including the array 319a of shadowing elements may provide a medium transmittance of patterning radiation therethrough less than the relatively high transmittance through the region without shadowing elements and greater than the relatively low transmittance through the region including the array 319b of shadowing elements. As discussed above, differences in transmittance in absolute terms may be relatively small with all regions of the substrate providing a transmittance of greater that 97% for the patterning radiation 321. By adding the arrays of shadowing elements, the uniformity of critical dimensions in the photosensitive layer 301 being patterned can be improved as shown by the dashed lines.

The transmittance through the arrays of shadowing elements can be varied, as discussed above, by providing differences in spacings of the shadowing elements in the different arrays. As shown in FIG. 3, for example, spacings in the array 319a may be greater than in the array 319b. The transmittance can also be varied by providing shadowing elements of a first size in one array and by providing shadowing elements of a second size in a second array. The shadowing elements of array 319a, for example, may be larger than shadowing elements of array 319b. The transmittance can also be varied by providing different numbers of layers of shadowing elements in different arrays. The array 319a, for example, may include a single layer of shadowing elements while the array 319b may include multiple layers of shadowing elements. According to embodiments of the present invention, differences in spacings of shadowing elements, differences in sizes of shadowing elements, differences in layers of shadowing elements, and/or differences in other characteristics of arrays of shadowing elements may be used individually or in combination to improve photomask performance.

Referring again to FIG. 1, an average of center-to-center spacings of shadowing elements within the array(s) 105 may be at least approximately 6 μm, and more particularly, an average of center-to-center spacing of shadowing elements may be at least approximately 8 μm. A transmittance of the patterning radiation through portions of the transparent substrate including the array(s) of shadowing elements may thus be greater than approximately 70%, and according to particular embodiments, greater than 97%. As discussed above, a transmittance through portions of the transparent substrate including the array(s) of shadowing elements may be varied between approximately 98% and 100% (with 100% being the transmittance of patterning radiation through a portion of the transparent substrate without shadowing elements).

The photomask of FIG. 1 may thus include a first array 105a of shadowing elements between first and second surfaces of the transparent substrate 101 at a central portion thereof, and a second array 105b of shadowing elements between first and second surfaces of the transparent substrate 101 at an edge portion thereof. Moreover, transmittances of the patterning radiation through the portions of the transparent substrate including the first and second arrays of shadowing elements may be greater than approximately 50%. The transmittance of the patterning radiation through the portion of the transparent substrate including the second array, however, may be different than the transmittance of the patterning radiation though the portion of the transparent substrate including the first array. As discussed above, transmittance through portions of the substrate including the second array 105b may be greater than transmittance through portions of the substrate including the first array 105a, for example, to compensate for differences in illumination intensities due to diffraction caused by the radiation blocking pattern 103. More particularly, transmittances through the different arrays of shadowing elements may vary between 98% and 100% (with 100% being the transmittance of patterning radiation through portions of the substrate without shadowing elements). For examples, different transmittances may be provided by providing different average center-to-center spacings of shadowing elements within different arrays.

In addition or in an alternative, different arrays may be used to provide different illumination conditions for different regions of an integrated circuit device being patterned. When fabricating an integrated circuit memory device (such as a dynamic random access memory device), different illumination conditions may be provided for memory cell array regions and for peripheral circuit regions. For example, a first array 150a of shadowing elements may be configured to provide a dipole illumination condition for a memory cell array region of an integrated circuit memory device, and a second array 150b of shadowing elements may be configured to provide an annular illumination condition for a peripheral circuit region of the same integrated circuit memory device.

Conventionally, an illumination condition may be determined by an aperture through which the patterning radiation is transmitted before reaching the photomask so that a same illumination condition is provided over the entirety of an integrated circuit device being patterned. According to embodiments of the present invention, different arrays of shadowing elements in a photomask may be used to provide different illumination conditions on different parts of an integrated circuit device during a same exposure step. An array of shadowing elements in a transparent substrate of a photomask may thus be configured to provide, for example, one of an annular illumination condition, a dipole illumination condition, a quadrapole illumination condition, or a customized illumination condition. Different arrays of shadowing elements in a photomask may thus be used to provide different illumination conditions on different regions of an integrated circuit device being patterned. In an alternative, an array(s) of shadowing elements in a photomask may be used to provide a uniform illumination condition (such as an annular illumination condition, a dipole illumination condition, a quadrapole illumination condition, or a customized illumination condition) across an integrated circuit device being patterned without requiring a particular aperture between a source of patterning radiation and the photomask.

Figure 4:
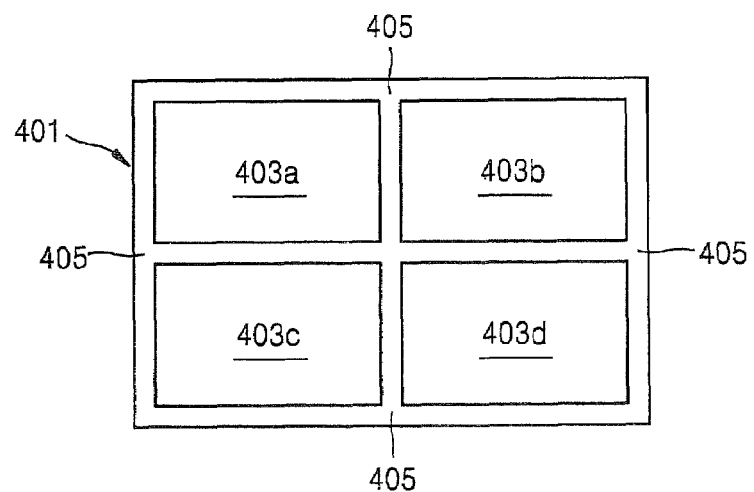
FIG. 4 is a plan view of a portion of a photomask including different regions according to embodiments of the present invention.

An integrated circuit memory device, for example, may include rectangular memory cell array regions with peripheral circuit regions separating the memory cell array regions. Accordingly, as shown in FIG. 4, a photomask 401 used to pattern such a device may include memory cell array regions 403a-d and peripheral circuit regions 405 separating the memory cell array regions. A radiation blocking pattern on a surface of the photomask may define the pattern to be transferred to a photosensitive layer on the integrated circuit memory device, and an array or arrays of shadowing elements between transparent surfaces may provide one or more illumination conditions for particular portions of the integrated circuit memory device being patterned. For example, first arrays of shadowing elements in the memory cell array regions 403a-d of the photomask 401 may provide a dipole illumination condition(s) for memory cell array regions of the integrated circuit memory device, and second arrays of shadowing elements in the peripheral circuit regions 405 may provide an annular illumination condition(s) for peripheral circuit regions of the integrated circuit memory device during a same masking step.

In addition or in an alternative, one or more arrays of shadowing elements may be configured to provide a holographic pattern used to generate a hologram on the integrated circuit device being patterned, and different holographic patterns may be provided by different arrays of shadowing elements in the same photomask. Similarly, one or more arrays of shadowing elements may be configured as a fresnel lens, and different fresnel lenses may be provided by different arrays of shadowing elements in the same photomask.

Figure 5:
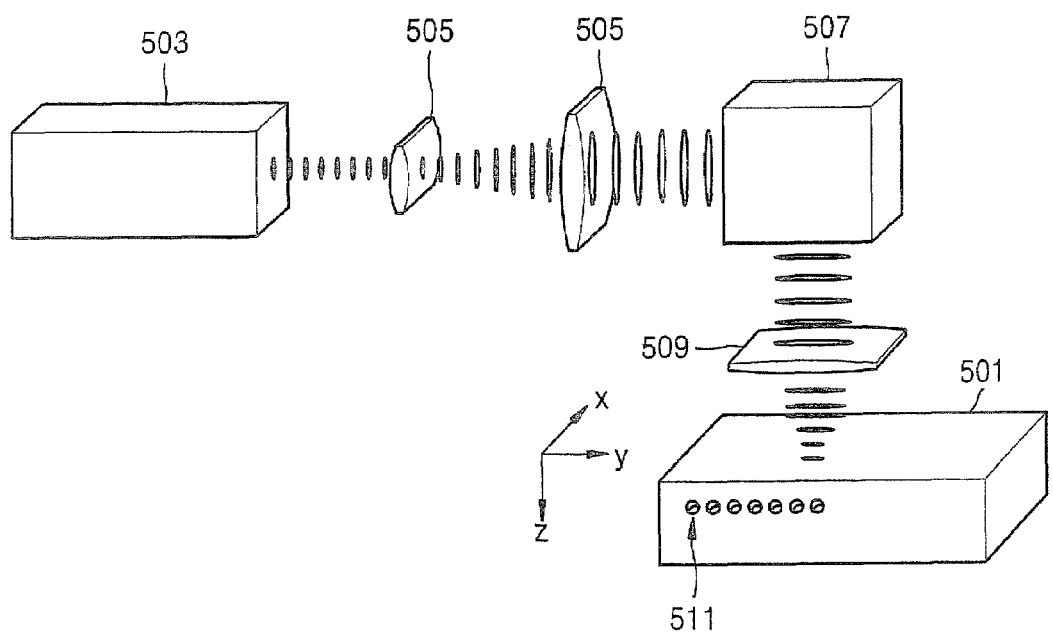
FIG. 5 is a block diagram illustrating systems and methods for forming arrays of shadowing elements according to embodiments of the present invention.

Shadowing elements may be formed in photomasks according to embodiments of the present invention using a system such as that illustrated in FIG. 5. As discussed above with respect to FIGS. 1-3, a photomask may include a radiation blocking pattern (such as a patterned layer of chrome) on a transparent substrate wherein the radiation blocking pattern corresponds to a pattern to be transferred to a photosensitive layer on an integrated circuit device. Moreover, the photomask can be used to pattern a test photosensitive layer prior to forming shadowing elements to determine what, if any, critical dimension non-uniformities may need to be corrected.

A desired array(s) of shadowing elements can be determined for the photomask based on the information obtained from the patterned test photoresist layer. By forming shadowing elements after forming the radiation blocking pattern, the shadowing elements can be aligned to the radiation blocking pattern. In addition, a pellicle can be placed on the photomask after forming the radiation blocking pattern but before patterning the test photosensitive layer and before forming shadowing elements. Accordingly, the radiation blocking pattern can be protected from dust before and during formation of the shadowing elements.

Shadowing elements 511 can then be formed between surfaces of the transparent substrate while maintaining the pellicle on the radiation blocking pattern of the photomask. While not shown in FIG. 5, the radiation blocking pattern and the pellicle may be on a surface of the transparent substrate 501 opposite the surface through which the laser radiation is introduced. The laser radiation may be generated by a laser source 503 (such as a femto second laser), and the laser radiation may be expanded using one or more expanders 505. The beam steering device 507 may direct the expanded laser radiation toward the transparent substrate 501, and the focusing device 509 may focus the laser radiation to a particular point where a shadowing element is to be formed.

The laser radiation can be directed to an X-Y coordinate (lateral position) of a particular shadowing element on the transparent substrate 501 using the beam steering device 507 and/or by physically moving the transparent substrate in the X-Y directions (perpendicular relative to the direction of the laser radiation). The laser radiation can be directed to a Z coordinate (depth) of a particular shadowing element in the transparent substrate 501 using a depth of focus provided by the focusing device 509 and/or by physically moving the transparent substrate in the Z direction (parallel to the direction of the laser radiation).

Each shadowing element may be formed using a pulsed burst of laser radiation directed to and focused on a predetermined location within a volume of the transparent substrate 501 between first and second surfaces thereof. A pulsed burst of laser radiation used to form a shadowing element, for example, may have a duration on the order of approximately $10^{-15}$ second. The pulsed burst of laser radiation may generate a micro-explosion at the predetermined location within the transparent substrate. Computerized control of shadowing element placement may be used to generate 2 and/or 3 dimensional array(s) of shadowing elements within the volume of the transparent substrate 501 between first and second surfaces of the transparent substrate.

When forming an individual shadowing element 511, the laser source 503 may generate a pulse of laser radiation having a duration on the order of $10^{-15}$ seconds, and the laser radiation may be expanded using one or more expanders 505 and then focused using focusing device 509. The steering device 507 may provide that the laser radiation is directed to desired X-Y coordinates of the transparent substrate, and the focusing device 509 may provide that the laser radiation is focused at a desired depth (Z coordinate) within the transparent substrate.

More particularly, the focusing device 509 may focus the laser radiation so that on the order of approximately $10^6$ W/cm$^2$ to $10^7$ W/cm$^2$ is concentrated at the depth within the transparent substrate at which the shadowing element is to be formed. With this concentration of energy, avalanche photon adsorption and/or ionization may generate a plasma zone in the transparent substrate (without melting or evaporating the substrate). Localized heating and cooling may result in a shock wave that generates a damaged zone having a morphologically different structure than that of surrounding portions of the transparent substrate 501. The resulting damaged zone thus provides a shadowing element 511 that may have a refractive index different than (either greater than or less than) that of surrounding portions of the transparent substrate 501. Light scattering at shadowing elements 511 thus formed may be used to change an imaging intensity of patterning radiation passing therethrough.

An individual shadowing element formed as discussed above may have a diameter in the range of approximately 0.1 μm to 4.0 μm, and more particularly, in the range of approximately 0.3 μm to 1.0 μm. Sizes of shadowing elements may be varied, for example, by varying an intensity of laser radiation, a duration of the laser radiation, size of the beam, and/or a number of laser radiation pulses used to form the shadowing element. In addition or in an alternative, a size of a shadowing element 511 may be increased by forming two or more overlapping shadowing elements.

Moreover, the steering device 507 and the focusing device 509 may align the shadowing elements within the volume of the transparent substrate 501 using a previously formed radiation blocking pattern formed on the opposite side of the transparent substrate. In addition, a pellicle may be maintained on the radiation blocking pattern while forming the shadowing elements so that the radiation blocking pattern is shielded from dust. In an alternative, the shadowing elements may be formed before forming the radiation blocking pattern, and the radiation blocking pattern may be aligned relative to the shadowing elements. In another alternative, both the radiation blocking pattern and the shadowing elements may be aligned relative to some other indicator formed independently of either the radiation blocking pattern or the shadowing elements.

Figure 6:
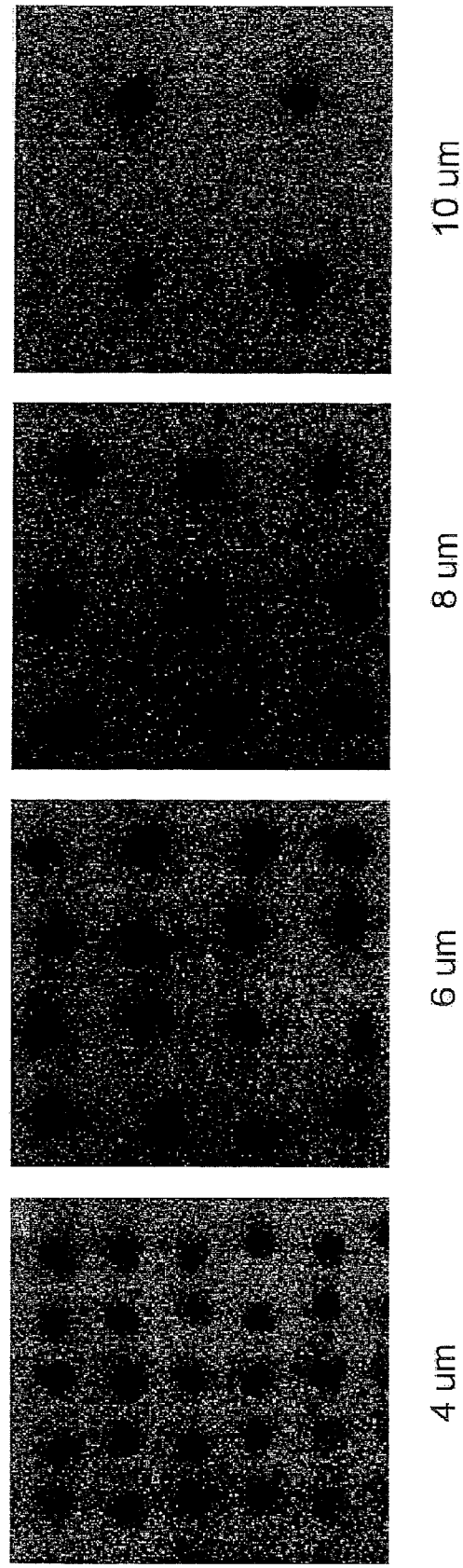
FIGS. 6a-d are photographs illustrating arrays of shadowing elements according to embodiments of the present invention.

Arrays of shadowing elements formed as discussed above are illustrated in FIGS. 6*a-d*. In FIG. 6*a*, the shadowing elements are arranged in an array of rows and columns with an average of center-to-center spacings of approximately 4.0 μm. In FIG. 6*b*, the shadowing elements are arranged in an array of rows and columns with an average of center-to-center spacings of approximately 6.0 μm. In FIG. 6*c*, the shadowing elements are arranged in an array of rows and columns with an average of center-to-center spacings of approximately 8.0 μm. In FIG. 6*d*, the shadowing elements are arranged in an array of rows and columns with an average of center-to-center spacings of approximately 10.0 μm.

Figure 7:
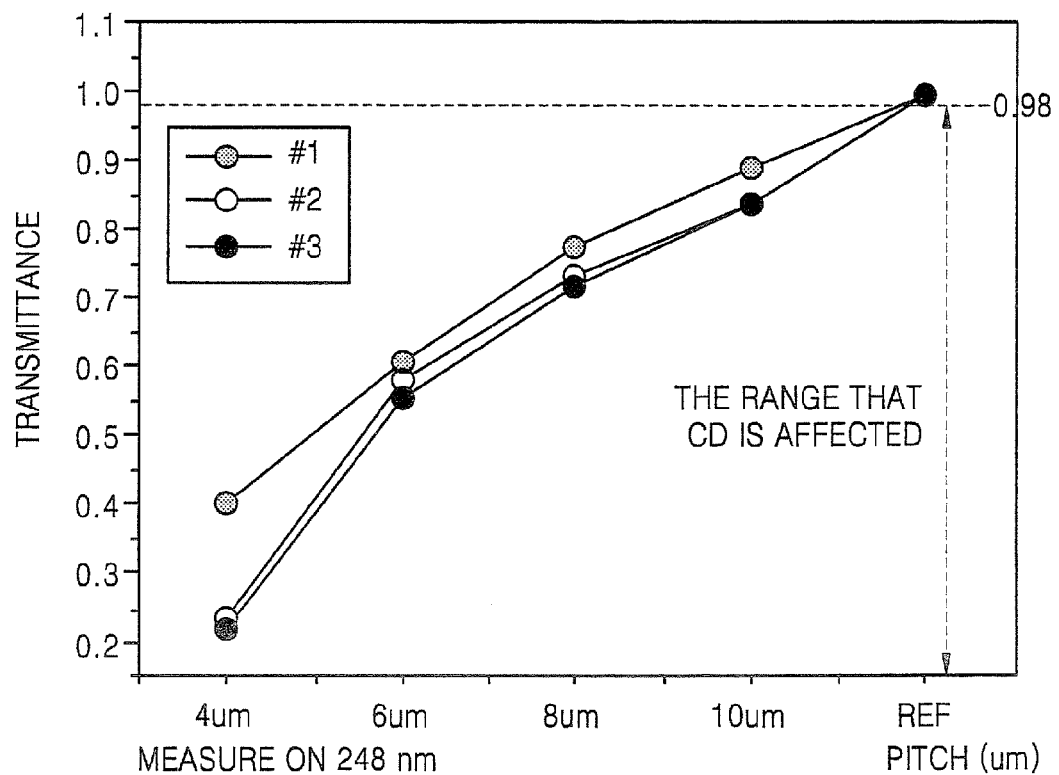
FIG. 7 is a graph illustrating transmittances of different arrays of shadowing elements according to embodiments of the present invention.

The graph of FIG. 7 illustrates measured transmittances of radiation (of 248 nm wavelength) through substrates including arrays of shadowing elements as illustrated in FIGS. 6*a-d*. More particularly, three sample transparent substrates were generated with each sample transparent substrate including four arrays of shadowing elements with average center-to-center spacings of 4.0 μm, 6.0 μm, 8.0 μm, and 10.0 μm. As shown, arrays of shadowing elements with average center-to-center spacings of approximately 4.0 μm may provide a transmittance in the range of approximately 20% to 40%. Arrays of shadowing elements with average center-to-center spacings of approximately 6.0 μm may provide a transmittance in the range of approximately 50% to 60%. Arrays of shadowing elements with average center-to-center spacings of approximately 8.0 μm may provide a transmittance in the range of approximately 70% to 80%. Arrays of shadowing elements with average center-to-center spacings of approximately 10.0 μm may provide a transmittance in the range of approximately 85% to 90%. The reference of 100% transmittance is measured with respect to a portion of the substrate free of shadowing elements. Moreover, a reduction in transmittance of approximately 2% may be sufficient to improve critical dimension (CD) tolerances.

As discussed above, a depth of the shadowing elements in the transparent substrate of a photomask may be determined by a position of the transparent substrate relative to the focusing device and by a focal point of the laser radiation from the focusing device. Moreover, the shadowing region of an integrated circuit device (being patterned) that is affected by a shadowing element (or array of shadowing elements) may be dependent on a distance of the shadowing element (or array of shadowing elements) from the surface of the transparent substrate having the radiation blocking pattern thereon. By providing the shadowing elements within the transparent substrate close to the surface having the radiation blocking pattern thereon, a resulting shadowing region on the integrated circuit device being patterned can be reduced. Control of critical dimensions (CD) can thus be provided with a resolution of less than approximately 1.26 mm. Stated in other words, shadowing elements according to embodiments of the present invention may provide improved resolution because the shadowing elements and the radiation blocking layer can be separated by less than a full thickness of the transparent substrate of the photomask. Accordingly, control of CD uniformity can be improved. Different arrays of shadowing elements may thus be used to provide different CD controls and/or different illumination conditions on closely spaced regions of an integrated circuit device (such as cell array and peripheral circuit regions).

Figure 8:
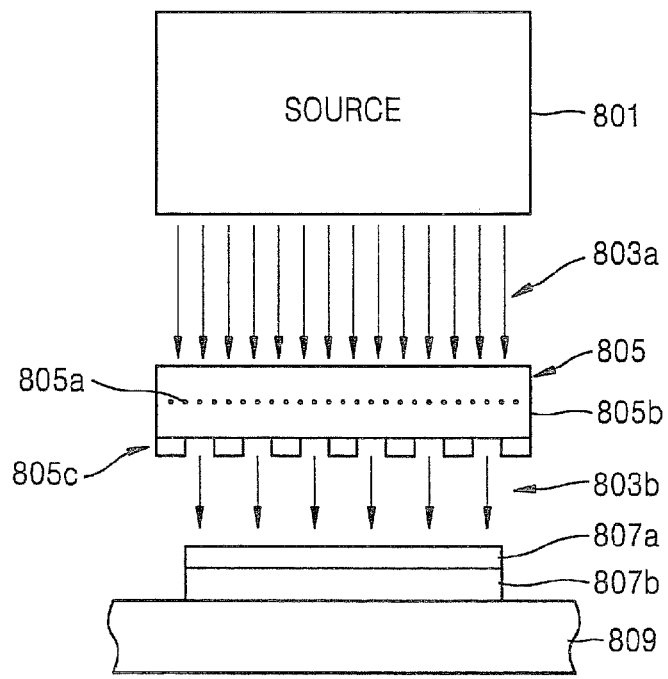
FIG. 8 is a block diagram illustrating patterning systems and methods according to embodiments of the present invention.
Figure 9:
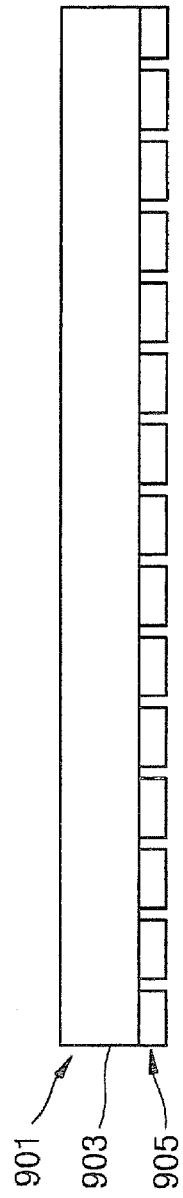
FIG. 9 is a cross-sectional view of a conventional photomask.
Figure 10:
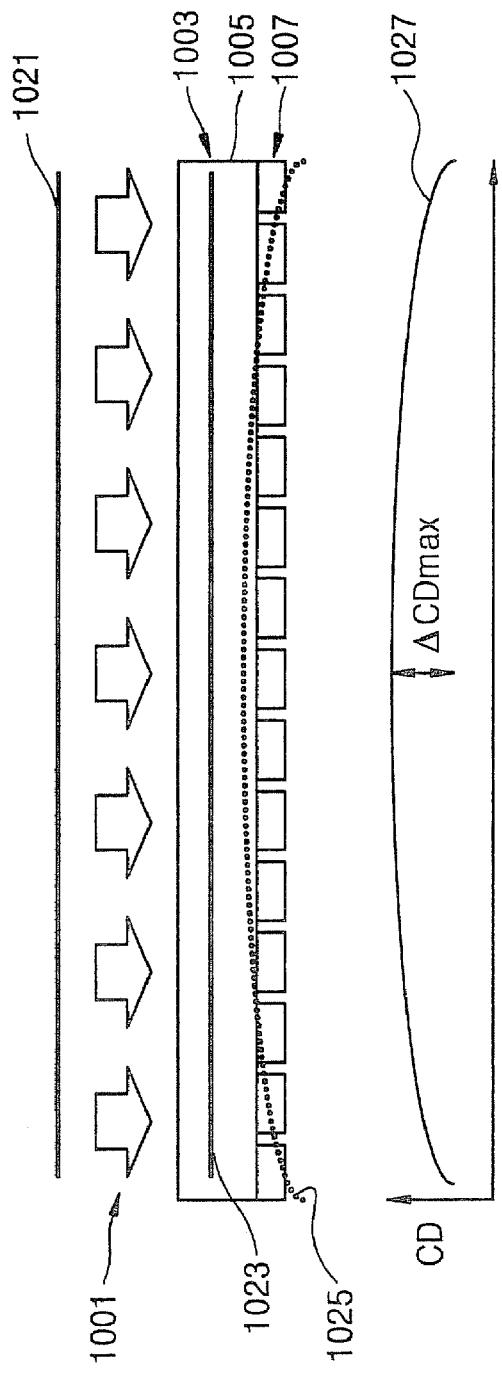
FIG. 10 is a cross-sectional view of a conventional photomask and relative attenuations of patterning radiation passing therethrough.

Photo masks according to embodiments of the present invention may thus be used to pattern photosensitive layers as shown, for example, in FIG. 8. A source 801 may generate patterning radiation 803*a*, such as radiation having a wavelength of approximately 248 nm. The patterning radiation 803*a* is directed through a photomask 805 having shadowing elements 805*a* within a volume of a transparent substrate 805*b* thereof. A radiation blocking pattern 805*c* (such as a chrome pattern) defines a pattern that is transferred to a photosensitive layer 807*a* on an integrated circuit substrate 807*b* using modified patterning radiation 803*b*. Moreover, the integrated circuit substrate 807*b* may be maintained in a desired orientation relative to the source 801 and the photomask 805*c* using chuck 809.

More particularly, the patterning radiation 803*a* from the source 801 is modified by passing through the photomask 805 (including the shadowing elements 805*a* and the radiation blocking pattern 805*c*) to provide the modified patterning radiation 803*b*. For example, the radiation blocking pattern 805*c* may define a pattern to be transferred to the photosensitive layer, and the shadowing elements 805*a* may be provided in arrays configured to compensate for effects caused by diffraction through the radiation blocking pattern 805*c*. In addition or in the alternative, the shadowing elements 805*a* may be configured to provide one or more illumination conditions (such as a dipole illumination condition, a quadrapole illumination condition, an annular illumination condition, and/or a customized illumination condition), to provide a holographic pattern on the photosensitive layer 807a, and/or to provide a fresnel lens, and/or to provide different illumination intensities. The photomask 805 may be formed as discussed above with respect to FIGS. 5-7 to provide one or more functionalities discussed above with respect to FIGS. 1-4.

While this invention has been particularly shown and described with reference to embodiments thereof, it will be understood by those skilled in the art that various changes in form and details may be made therein without departing from the spirit and scope of the invention as defined by the appended claims.

That which is claimed is:

1. A method of patterning an integrated circuit device, the method comprising:
    providing an integrated circuit substrate having a photosensitive layer thereon;
    projecting patterning radiation through a photomask to the photosensitive layer on the integrated circuit substrate, the photomask including,
        a transparent substrate having first and second opposing surfaces,
        a pattern of radiation blocking regions on at least one of the first and/or second surfaces of the transparent substrate, the pattern of radiation blocking regions defining a pattern to be transferred to the integrated circuit device; and
        an array of shadowing elements within the transparent substrate between the first and second opposing surfaces wherein a shadowing element of the array has a light transmittance characteristic different than that of an adjacent portion of the transparent substrate and wherein a transmittance of the patterning radiation through a portion of the transparent substrate including the array of shadowing elements is greater than approximately 20%.

2. A method according to claim 1 wherein a shadowing element of the array has an index of refraction that is different than that of an adjacent portion of the transparent substrate.

3. A method according to claim 1 wherein an average of center-to-center spacings of the shadowing elements within the array is at least approximately 6 μm.

4. A method according to claim 3 wherein an average of center-to-center spacing of the shadowing elements within the array is at least approximately 8 μm.

5. A method according to claim 1 wherein the transmittance of the patterning radiation through portions of the transparent substrate including the array of shadowing elements is greater than approximately 70%.

6. A method according to claim 1 wherein the photomask further includes:
    a second array of shadowing elements within the transparent substrate between the first and second opposing surfaces wherein a shadowing element of the second array has a light transmittance characteristic different than that of an adjacent portion of the transparent substrate, wherein a transmittance of the patterning radiation through a portion of the transparent substrate including the second array of shadowing elements is greater than approximately 20%, and wherein the transmittance of the patterning radiation through the portion of the transparent substrate including the second array is different than the transmittance of the patterning radiation though the portion of the transparent substrate including the first array.

7. A method according to claim 6 wherein the first array of shadowing elements is configured to provide a first illumination condition for a first portion of the integrated circuit substrate and wherein the second array of shadowing elements is configured to provide a second illumination condition for a second portion of the integrated circuit substrate wherein the first and second illumination conditions are different.

8. A method according to claim 7 wherein the first illumination condition comprises one of annular illumination, dipole illumination, or quadrapole illumination, and wherein the second illumination condition comprises another of annular illumination, dipole illumination, or quadrapole illumination.

9. A method according to claim 6 wherein an average of center-to-center spacings of the shadowing elements within the first array is different than an average of center-to-center spacings of the shadowing elements within the second array.

10. A method according to claim 9 wherein the transmittance of the patterning radiation through portions of the transparent substrate including the first and second arrays of shadowing elements is greater than approximately 70%.

11. A method according to claim 1 wherein the array of shadowing elements is configured to provide a holographic pattern used to generate a hologram on the integrated circuit device.

12. A method according to claim 1 wherein the array of shadowing elements is configured as a fresnel lens.

13. A method according to claim 1 wherein the pattern of radiation blocking regions comprises a pattern of a metal.

14. A method according to claim 13 wherein the metal comprises chrome.

15. A method according to claim 1 wherein a diameter of a shadowing element in the array is in the range of approximately 0.1 μm to 4 μm.

16. A method according to claim 15 wherein a diameter of a shadowing element in the array is in the range of approximately 0.3 μm to 1 μm.

* * * * *